(12) United States Patent
Shih

(10) Patent No.: US 11,901,344 B2
(45) Date of Patent: Feb. 13, 2024

(54) MANUFACTURING METHOD OF SEMICONDUCTOR PACKAGE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 231 days.

(21) Appl. No.: 17/506,706

(22) Filed: Oct. 21, 2021

(65) Prior Publication Data

US 2022/0045036 A1 Feb. 10, 2022

Related U.S. Application Data

(62) Division of application No. 16/264,711, filed on Feb. 1, 2019, now Pat. No. 11,195,823.

(51) Int. Cl.
*H01L 23/49* (2006.01)
*H01L 25/10* (2006.01)
(Continued)

(52) U.S. Cl.
CPC ........ *H01L 25/105* (2013.01); *H01L 21/4853* (2013.01); *H01L 21/4857* (2013.01);
(Continued)

(58) Field of Classification Search
CPC ... H01L 25/0655; H01L 25/105; H01L 24/19; H01L 24/20; H01L 21/56; H01L 23/3107; H01L 25/0652; H01L 25/50; H01L 2224/12105; H01L 2224/97; H01L 2225/06568; H01L 2224/48227; H01L 2224/92244; H01L 25/0657; H01L 21/561; H01L 21/568; H01L 2225/1035; H01L 2224/32225; H01L 2224/32145; H01L 2224/73267; H01L 2924/15311; H01L 2224/04105; H01L 2224/19; H01L 2224/24137; H01L 2224/48091; H01L 2924/3512; H01L 2225/1058; H01L 2225/1041; H01L 2225/0652; H01L 2225/06548; H01L 2225/0651; H01L 23/28; H01L 25/073; H01L 23/498–49894; H01L 21/4846–4867; H01L 21/4807–481; H01L 2225/06541;
(Continued)

(56) References Cited

U.S. PATENT DOCUMENTS

| | | | |
|---|---|---|---|
| 2014/0225246 A1* | 8/2014 | Henderson | H01L 23/5384 257/691 |
| 2018/0226349 A1* | 8/2018 | Yu | H01L 21/568 |
| 2020/0176416 A1* | 6/2020 | Ketterson | H01L 21/565 |

* cited by examiner

*Primary Examiner* — Moin M Rahman
(74) *Attorney, Agent, or Firm* — JCIPRNET

(57) ABSTRACT

A manufacturing method of a semiconductor package is provided as follows. A semiconductor die is provided, wherein the semiconductor die comprises a semiconductor substrate, an interconnection layer and a through semiconductor via, the interconnection layer is disposed on an active surface of the semiconductor substrate, the through semiconductor via penetrates the semiconductor substrate from a back surface of the semiconductor substrate to the active surface of the semiconductor substrate. An encapsulant is provided to laterally encapsulate the semiconductor die. A through encapsulant via penetrating through the encapsulant is formed.

7 Claims, 12 Drawing Sheets

(51) Int. Cl.
  *H01L 23/48* (2006.01)
  *H01L 23/31* (2006.01)
  *H01L 23/498* (2006.01)
  *H01L 25/00* (2006.01)
  *H01L 21/56* (2006.01)
  *H01L 21/48* (2006.01)
  H01L 23/538 (2006.01)

(52) U.S. Cl.
  CPC ........ *H01L 21/568* (2013.01); *H01L 23/3107* (2013.01); *H01L 23/481* (2013.01); *H01L 23/49816* (2013.01); *H01L 23/49822* (2013.01); *H01L 23/49827* (2013.01); *H01L 23/49838* (2013.01); *H01L 25/50* (2013.01); *H01L 23/5384* (2013.01); *H01L 2225/06541* (2013.01)

(58) Field of Classification Search
  CPC ... H01L 2224/06181; H01L 2223/6616; H01L 21/4857; H01L 23/481; H01L 24/25; H01L 24/16; H01L 24/32; H01L 24/73; H01L 24/48; H01L 2224/16227; H01L 2224/2518; H01L 2224/73204; H01L 2224/73265; H01L 2221/68359; H01L 2225/1023; H01L 2924/1533; H01L 21/6835; H01L 25/071; H01L 25/07; H01L 2221/68345
  See application file for complete search history.

MANUFACTURING METHOD OF SEMICONDUCTOR PACKAGE

CROSS REFERENCE TO RELATED APPLICATION

This application is a divisional application of and claims the priority benefit of U.S. application Ser. No. 16/264,711, filed on Feb. 1, 2019, now allowed. The entirety of the above-mentioned patent application is hereby incorporated by reference herein and made a part of specification.

BACKGROUND

Technical Field

The present disclosure generally relates to a manufacturing method of a semiconductor package, and particularly, to a manufacturing method of a three-dimensional semiconductor package.

Description of Related Art

As the demand for even smaller electronic devices has grown recently, there has grown a need for smaller and more creative packaging techniques of semiconductor dies. An example of these packaging technologies is the Package-on-Package (PoP) technology. A PoP package includes a stack of semiconductor packages, and can be regarded as a three-dimensional semiconductor package. In an exemplary PoP package, a middle semiconductor package is interposed between a top semiconductor package and a bottom semiconductor package. Currently, signals sending between the middle and top semiconductor packages as well as signals sending between the middle and bottom semiconductor packages both have to go through a front-side redistribution layer (RDL) of the middle semiconductor package. As a result, requirement on routing density of this front-side RDL would be very high, and reliability of the package structure may be compromised.

SUMMARY

Accordingly, the present disclosure is directed to a PoP semiconductor package with improved reliability. In addition, the present disclosure is also directed to a manufacturing method of the PoP semiconductor package.

According to some embodiments of the present disclosure, a semiconductor package includes a semiconductor die, an encapsulant and a through encapsulant via. The semiconductor die includes a semiconductor substrate, an interconnection layer and a through semiconductor via (TSV). The semiconductor substrate has an active surface and a back surface opposite to the active surface. The interconnection layer is disposed over the active surface of the semiconductor substrate. The TSV penetrates through the semiconductor substrate from the back surface of the semiconductor substrate to the active surface of the semiconductor substrate. The encapsulant laterally encapsulates the semiconductor die. The through encapsulant via penetrates through the encapsulant.

In some embodiments, the semiconductor package further includes a front redistribution structure and a back redistribution structure. The front redistribution structure is disposed over the interconnection layer and a front surface of the encapsulant. The front redistribution is electrically connected with the interconnection layer and the through encapsulant via. The back redistribution structure is disposed over the back surface of the semiconductor substrate and a back surface of the encapsulant. The back surface of the encapsulant is opposite to the front surface of the encapsulant, and the back redistribution structure is electrically connected with the TSV and the through encapsulant via.

In some embodiments, the semiconductor package further includes front electrical connectors and back electrical connectors. The front electrical connectors are disposed over the front redistribution structure, and electrically connected with the front redistribution structure. The back electrical connectors are disposed over the back redistribution structure, and electrically connected with the back redistribution structure.

In some embodiments, a back surface of the encapsulant is substantially coplanar with the back surface of the semiconductor substrate.

In some embodiments, a front surface of the encapsulant is substantially coplanar with a front surface of the semiconductor die. The active surface of the semiconductor substrate faces toward the front surface of the semiconductor die, and the back surface of the semiconductor substrate faces away from the front surface of the semiconductor die.

In some embodiments, the semiconductor die includes a memory die.

According to some embodiments of the present disclosure, a semiconductor package stack includes the aforementioned semiconductor package, a bottom semiconductor package and a top semiconductor package. The bottom semiconductor package is attached to a bottom surface of the semiconductor package, and electrically connected with the interconnection layer and the through encapsulant via. The top semiconductor package is attached to a top surface of the semiconductor package, and electrically connected with the TSV and the through encapsulant via.

In some embodiments, the bottom semiconductor package includes a bottom semiconductor die, a bottom encapsulant and a bottom through encapsulant via. The bottom encapsulant encapsulates the bottom semiconductor die. The bottom through encapsulant via penetrates through the bottom encapsulant, and electrically connected with the through encapsulant via of the semiconductor package.

In some embodiments, a top surface of the bottom semiconductor die is buried in the bottom encapsulant. A bottom surface of the bottom semiconductor die is substantially coplanar with a bottom surface of the bottom encapsulant.

In some embodiments, the semiconductor package stack further includes a package substrate, attached to a bottom surface of the bottom semiconductor package.

According to some embodiments of the present disclosure, a manufacturing method of a semiconductor package includes: providing a semiconductor die, wherein the semiconductor die includes a semiconductor substrate, an interconnection layer and a TSV, the interconnection layer is disposed on an active surface of the semiconductor substrate, the TSV penetrates the semiconductor substrate from a back surface of the semiconductor substrate to the active surface of the semiconductor substrate; laterally encapsulating the semiconductor die with an encapsulant; and forming a through encapsulant via penetrating through the encapsulant.

In some embodiments, the manufacturing method of the semiconductor package further includes: attaching the semiconductor die onto a first carrier before forming the encapsulant. The back surface of the semiconductor substrate faces toward the first carrier, and the active surface of the semiconductor substrate faces away from the first carrier;

and detaching the first carrier after forming the encapsulant and the through encapsulant via.

In some embodiments, the step of forming the through encapsulant via precedes the step of forming the encapsulant.

In some embodiments, the steps of forming the encapsulant, attaching the semiconductor die to the first carrier and forming the through encapsulant via includes: forming the through encapsulant via over a surface of the first carrier; attaching the semiconductor die onto the surface of the first carrier; and laterally encapsulating the semiconductor die and the through encapsulant via with the encapsulant.

In some embodiments, the step of forming the through encapsulant via follows the step of forming the encapsulant.

In some embodiments, the steps of attaching the semiconductor die to the first carrier, forming the encapsulant and forming the through encapsulant via includes: attaching the semiconductor die onto a surface of the first carrier; laterally encapsulating the semiconductor die with the encapsulant; removing a portion of the encapsulant to form a through hole; and filling the through hole with a conductive material, to form the through encapsulant via.

In some embodiments, the manufacturing method of the semiconductor package, further includes: forming a front redistribution structure over the interconnection layer and a front surface of the encapsulant, wherein the front redistribution structure is electrically connected with the interconnection layer and the through encapsulant via; and forming front electrical connectors over the front redistribution structure, wherein the front electrical connectors are electrically connected with the front redistribution structure.

In some embodiments, after forming the encapsulant and the through encapsulant via, the manufacturing method of the semiconductor package further includes: attaching a second carrier to surfaces of the encapsulant, the semiconductor die and the through encapsulant via that face away from the carrier.

In some embodiments, the manufacturing method of the semiconductor package further includes: forming a back redistribution structure over the back surface of the semiconductor substrate and a back surface of the encapsulant, wherein the back redistribution structure is electrically connected with the TSV and the through encapsulant via; forming back electrical connectors over the back redistribution structure, wherein the back electrical connectors are electrically connected with the back redistribution structure; and detaching the second carrier.

According to some embodiments of the present disclosure, a manufacturing method of a semiconductor package stack includes: the above mentioned manufacturing method of the semiconductor package; attaching a top semiconductor package to a top surface of the semiconductor package, wherein the top semiconductor package is electrically connected with the TSV and the through encapsulant via; and attaching a bottom semiconductor package to a bottom surface of the semiconductor package, wherein the bottom semiconductor package is electrically connected with the interconnection layer and the through encapsulant via.

As above, the semiconductor package of the present disclosure includes both of the through encapsulant via and the TSV. The through encapsulant via penetrates through the encapsulant that laterally surrounds the semiconductor die in the semiconductor package, whereas the TSV penetrates the semiconductor die from a back side of the semiconductor die to an active side of the semiconductor die. When the semiconductor package is stacked between top and bottom semiconductor packages, communications between the top semiconductor package and the bottom semiconductor package can be realized via the through encapsulant via. On the other hand, signals from the back side of the semiconductor die (e.g., signals from the top semiconductor package) can be transmitted to the active side of the semiconductor die via the TSV without going through the through encapsulant via and the front redistribution structure disposed at the active side of the semiconductor die, and vice versa. As such, transmission length of the signals transmitted between the back side of the semiconductor die and the active side of the semiconductor die is shortened. In addition, requirement on routing density of the front redistribution structure of the semiconductor package can be alleviated, and reliability of the semiconductor package can be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
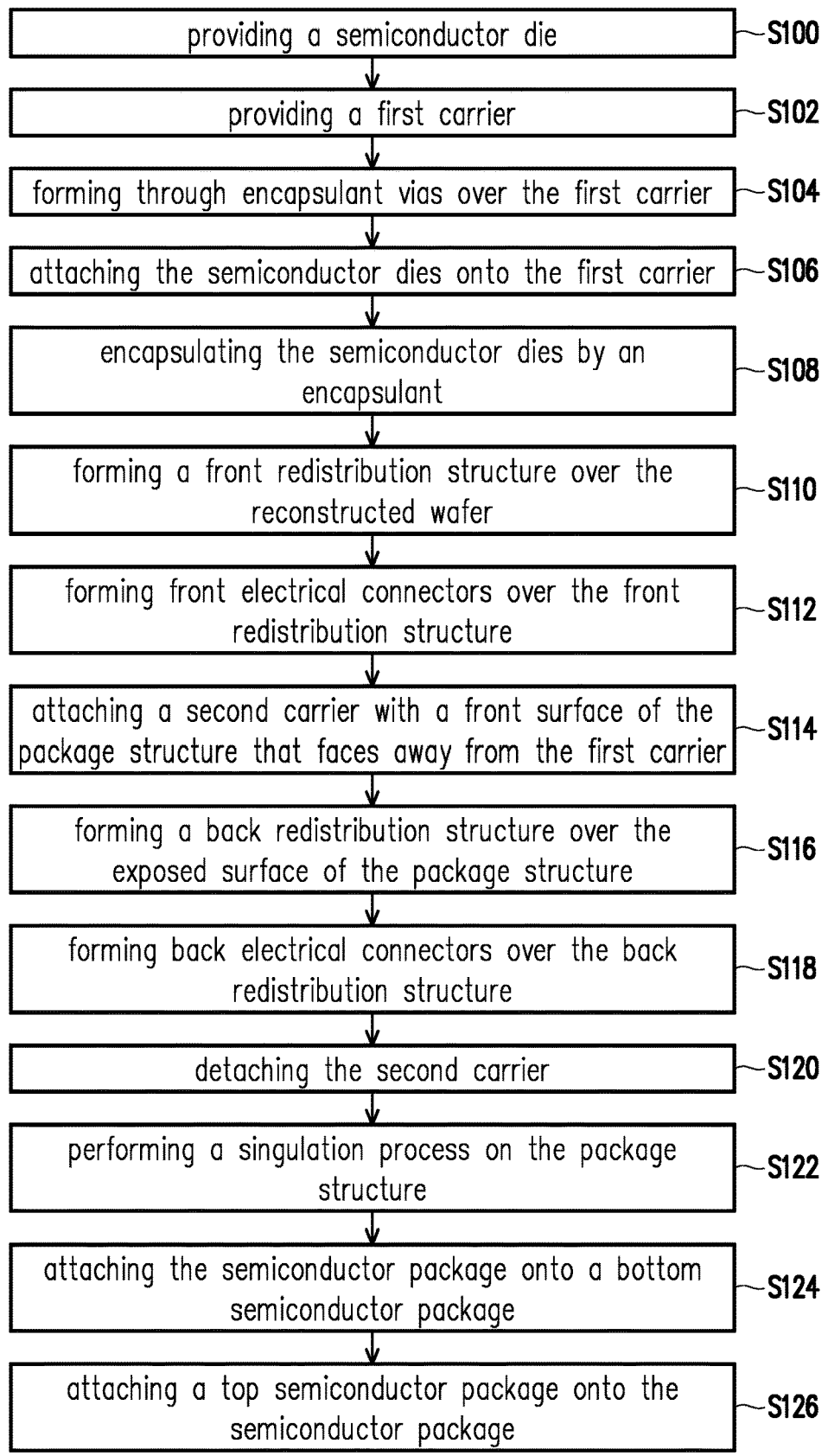
FIG. 1 is a process flow diagram illustrating a manufacturing method of a semiconductor package according to some embodiments of the present disclosure.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a process flow diagram illustrating a manufacturing method of a semiconductor package according to some embodiments of the present disclosure. FIG. 2A through FIG. 2K are cross-sectional views of structures at various stages during the manufacturing method of the semiconductor package according to some embodiments of the present disclosure.

Figure 2A:
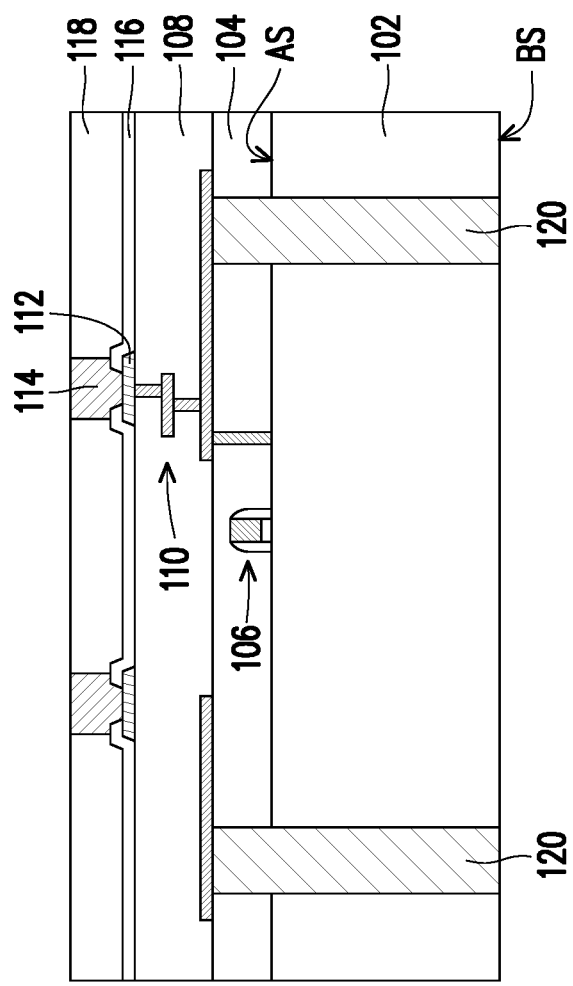
FIG. 2A through FIG. 2K are cross-sectional views of structures at various stages during the manufacturing method of the semiconductor package according to some embodiments of the present disclosure.

Referring to FIG. 1 and FIG. 2A, step S100 is performed, and a semiconductor die 100 is provided. In some embodiments, the semiconductor die 100 may be a memory die, such as a dynamic random access memory (DRAM) die. The semiconductor die 100 includes a semiconductor substrate 102 and a device layer 104 disposed over the semiconductor substrate 102. The semiconductor substrate 102 may be a semiconductor wafer or a semiconductor-on-insulator (SOI) wafer. A semiconductor material of the semiconductor wafer or the SOI wafer may include an elemental semiconductor material, a semiconductor alloy or a semiconductor compound. For instance, the elemental semiconductor may include Si or Ge. The semiconductor alloy may include SiGe, SiGeC or the like, whereas the semiconductor compound may include SiC, a III-V semiconductor or a II-VI semiconductor. The semiconductor substrate 102 has an active surface AS and a back surface BS opposite to the active surface AS. The device layer 104 is formed over the active surface AS of the semiconductor substrate 102. Some portions of semiconductor devices 106 may be formed in the device layer 104, whereas other portions (not shown) of the semiconductor devices 106 may be embedded in the semiconductor substrate 102. In some embodiments, the semiconductor devices 106 may include memory devices. For instance, the semiconductor devices 106 may include transistors, capacitors, the like or combinations thereof.

An interconnection layer 108 is disposed over the device layer 104. A plurality of interconnection elements 110 are formed in the interconnection layer 108, and are electrically connected with the underlying semiconductor devices 106. For instance, the interconnection elements 110 may include conductive vias, conductive traces or a combination thereof. In addition, conductive pads 112 may be formed over the interconnection layer 108. The conductive pads 112 are electrically connected with the interconnection elements 110. In some embodiments, at least one passivation layer 116 is formed over the conductive pads 112, and has openings at least partially exposing front surfaces of the conductive pads 112 (i.e., top surfaces of the conductive pads 112 as shown in FIG. 2A). Conductive pillars 114 may be formed on the passivation layer 116, and extend into these openings of the passivation layer 116, so as to be electrically connected with the conductive pads 112. In some embodiments, portions of the conductive pillars 114 protruded from the passivation layer 116 may be laterally surrounded by an insulating material 118. In these embodiments, a front surface of the insulating material 118 (i.e., a top surface of the insulating material 118 as shown in FIG. 2A) may be substantially coplanar with front surfaces of the conductive pillars 114 (i.e., top surfaces of the conductive pillars 114 as shown in FIG. 2A). In alternative embodiments, the front surfaces of the conductive pillars 114 are currently covered by the insulating material 118, and will be exposed when a planarization process is performed on the semiconductor die 100 and the encapsulant (e.g., the encapsulant 124 as shown in FIG. 2D) laterally surrounding the semiconductor die 100 in the following step (e.g., step S108).

Furthermore, the semiconductor die 100 also includes through semiconductor vias (TSVs) 120. The TSVs 120 penetrate through the semiconductor substrate 102 from the back surface BS of the semiconductor substrate 102 to the active surface AS of the semiconductor substrate 102, and are electrically connected with the interconnection elements 110 formed in the interconnection layer 108. As shown in FIG. 2A, in some embodiments, the TSV 120 further penetrates through the device layer 104, and is in contact with the interconnection layer 108. In these embodiments, formation of the semiconductor die 100 is based on a TSV-middle process. In other words, the TSVs 120 are formed after forming the device layer 104, but before forming the interconnection layer 108. By disposing the TSVs 120, signals from the back surface BS of the semiconductor substrate 102 can be transmitted to the semiconductor devices 106 at the active surface AS of the semiconductor substrate 102 via the TSVs 120 and the interconnection elements 110. In some embodiments, the semiconductor devices 106 are located within a central region of the semiconductor die 100, whereas the TSVs 120 are disposed within a peripheral region of the semiconductor die 100.

In alternative embodiments, front surfaces of the TSVs 120 (i.e., top surfaces of the TSVs 120 as shown in FIG. 2A) are substantially coplanar with the active surface AS of the semiconductor substrate 102, and the TSVs 120 may be electrically connected with the interconnection elements 110 by contact plugs (not shown) extending from the front surfaces of the TSVs 120 to a front surface of the device layer 104 (i.e., a top surface of the device layer 104 as shown in FIG. 2A). In these alternative embodiments, formation of the semiconductor die 100 is based on a TSV-first process. That is, formation of the TSVs 120 precedes the steps of forming the device layer 104 and the interconnection layer 108. In other embodiments, substantially the whole semiconductor die 100 is penetrated by the TSVs 120. In those embodiments, formation of the semiconductor die 100 is based on a TSV-last process, and the TSVs 120 are formed after forming the device layer 104 and the interconnection layer 108.

Figure 2B:
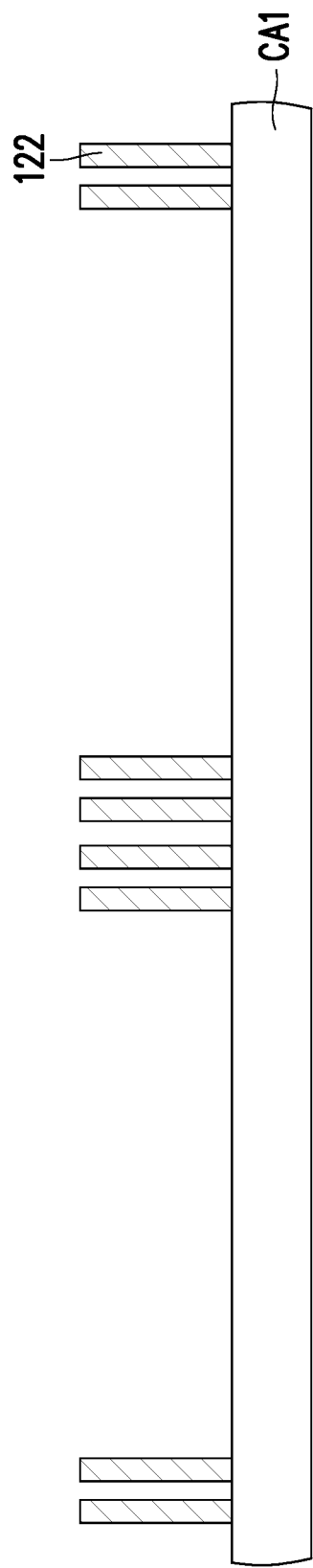

Referring to FIG. 1 and FIG. 2B, step S102 is performed, and a first carrier CA1 is provided. In some embodiments, the first carrier CA1 is a glass carrier. In addition, an adhesion layer (not shown) may be formed over a surface of the first carrier CA1 to which the semiconductor dies 100 are attached in the following step. In some embodiments, the adhesion layer may be a light-to-heat-conversion (LTHC) layer, a thermal release layer or the like.

In some embodiments, step S104 is performed, and through encapsulant vias (also known as through interposer vias (TIVs)) 122 may be formed over the first carrier CA1. In those embodiments of which the adhesion layer is pre-formed on the first carrier CA1, the adhesion layer would be located between the through encapsulant vias 122 and the first carrier CA1. The through encapsulant vias 122 may be conductive pillars. In some embodiments, a formation method of the through encapsulant vias 122 includes globally forming a seed layer (not shown) on the first carrier CA1. Thereafter, a photoresist pattern (not shown) having openings defining locations and dimensions of the through encapsulant vias 122 is formed over the seed layer. A conductive material is then filled in the openings of the photoresist pattern by, for example, a plating process, so as to form the through encapsulant vias 122. Afterwards, the photoresist pattern is removed by, for example, a stripping process or an ashing process.

Figure 2C:
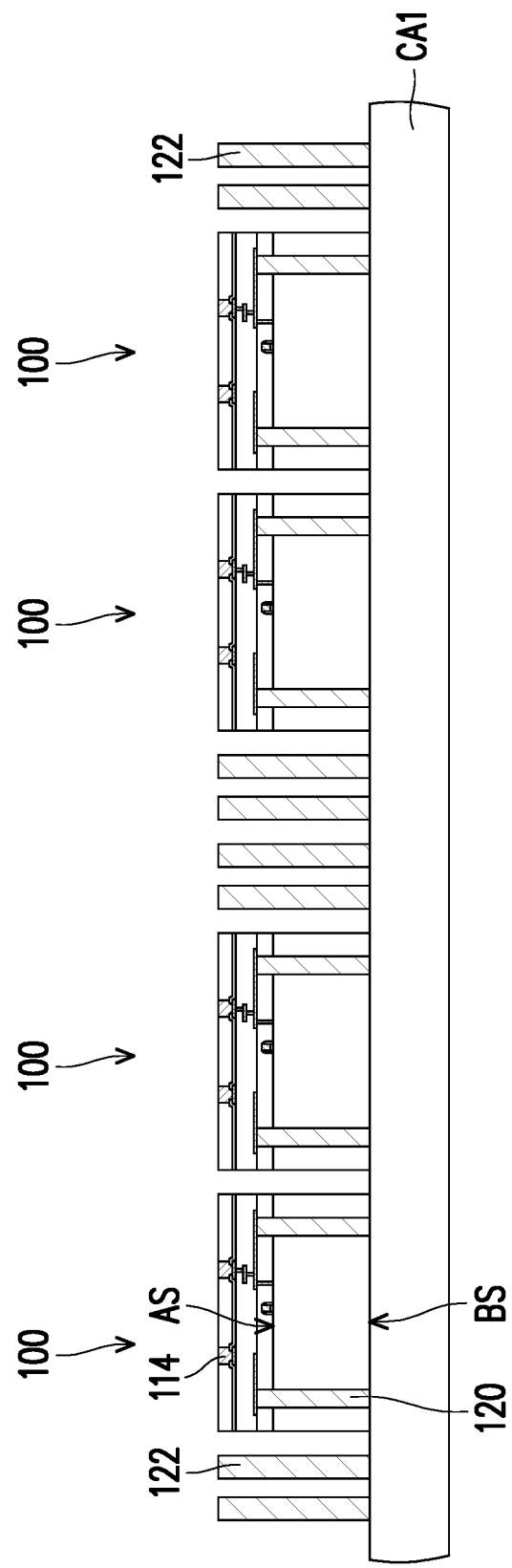
Figure 2D:
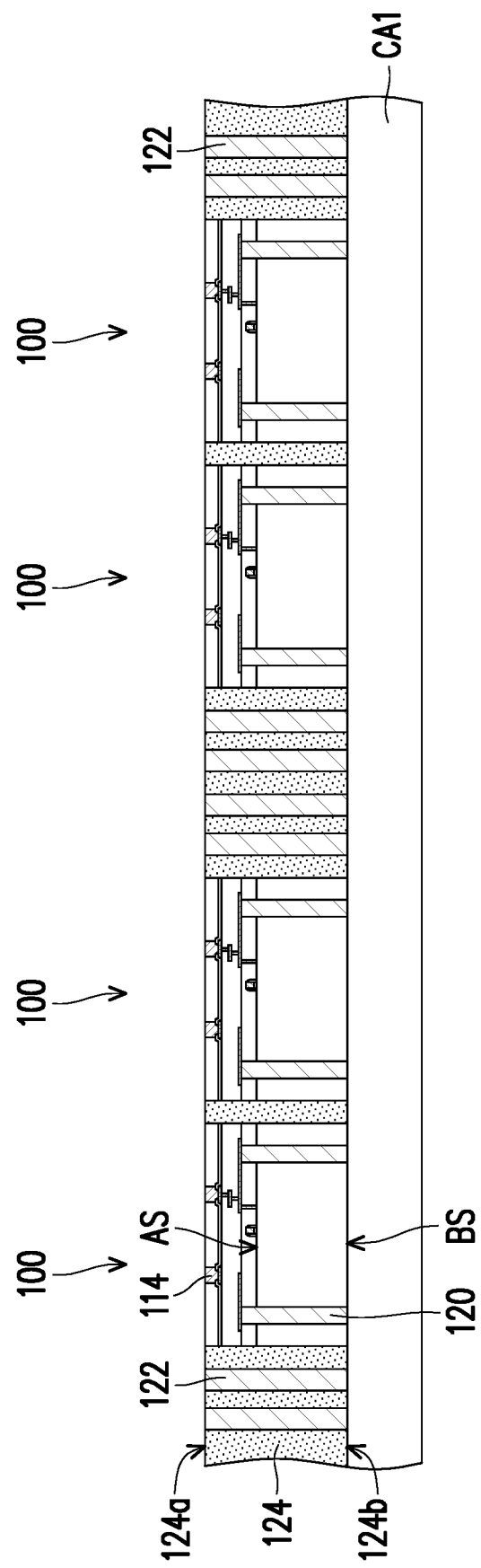

Referring to FIG. 1 and FIG. 2C, step S106 is performed, and a plurality of the semiconductor dies 100 are attached onto the first carrier CA1. The attached semiconductor dies 100 face upward. In other words, back surfaces BS of the semiconductor substrates 102 face toward the first carrier CA1, whereas active surfaces AS of the semiconductor substrates 102 face away from the first carrier CA1. In some embodiments, the through encapsulant vias 122 are pre-formed on the first carrier CA1, and a spacing between some adjacent through encapsulant vias 122 may be sufficiently large to accommodate at least one of the semiconductor dies 100. For instance, as shown in FIG. 2C, 4 of the semiconductor dies 100 are attached onto the first carrier CA1, and each 2 of the semiconductor dies 100 are located between adjacent through encapsulant vias 122. However, those skilled in the art may adjust the amount of the semiconductor die(s) 100 attached onto the first carrier CA1 as well as the arrangement of the through encapsulant vias 122 and the semiconductor dies 100, the present disclosure is not limited thereto. In some embodiments, the semiconductor dies 100 are attached onto the first carrier CA1 by a pick-and-place (PNP) process. In these embodiments, the pre-formed through encapsulant vias 122 may be functioned as alignment references.

Referring to FIG. 1 and FIG. 2D, step S108 is performed, and the semiconductor dies 100 are encapsulated by an encapsulant 124. As such, a reconstructed wafer including the semiconductor dies 100 and the encapsulant 124 is formed. In those embodiments of which the through encapsulant vias 122 are pre-formed on the first carrier CA1, both of the through encapsulant vias 122 and the semiconductor dies 100 are encapsulated by the encapsulant 124. The through encapsulant vias 122 can be regarded as penetrating the encapsulant 124. In some embodiments, the through encapsulant vias 122 and the semiconductor dies 100 may be over-molded by an encapsulant material, such that the through encapsulant vias 122 and the semiconductor dies 100 are buried in the encapsulant material. Thereafter, a planarization process may be performed on the encapsulant material to expose front surfaces of the through encapsulant vias 122 and the conductive pillars 114 of the semiconductor dies 100 (i.e., top surfaces of the through encapsulant vias 122 and the conductive pillars 114 as shown in FIG. 2D), so as to form the encapsulant 124. In some embodiments, a front surface 124a of the encapsulant 124 is substantially coplanar with the front surfaces of the through encapsulant vias 122 and the conductive pillars 114. On the other hand, a back surface 124b of the encapsulant 124 is substantially coplanar with bottom surfaces of the through encapsulant vias 122 and the back surfaces BS of the semiconductor dies 100. For instance, the planarization process may include a chemical mechanical polishing (CMP) process or an etching process.

In alternative embodiments, the step of forming the encapsulant 124 (i.e. step S108) precedes the step of forming the through encapsulant vias 122 (i.e., step S104). In these embodiments, the semiconductor dies 100 are encapsulated by the encapsulant 124 in step S108. Thereafter, in step S104, some portions of the encapsulant 124 are removed to form through holes in the encapsulant 124, and a conductive material is filled in the through holes in the encapsulant 124, so as to form the through encapsulant vias 122. In some embodiments, a material of the encapsulant 124 is a photosensitive material, and the through holes can be formed by a photolithography process. In other embodiments, the encapsulant 124 is non-photosensitive, and the through holes are formed by a photolithography process and an etching process.

Figure 2E:
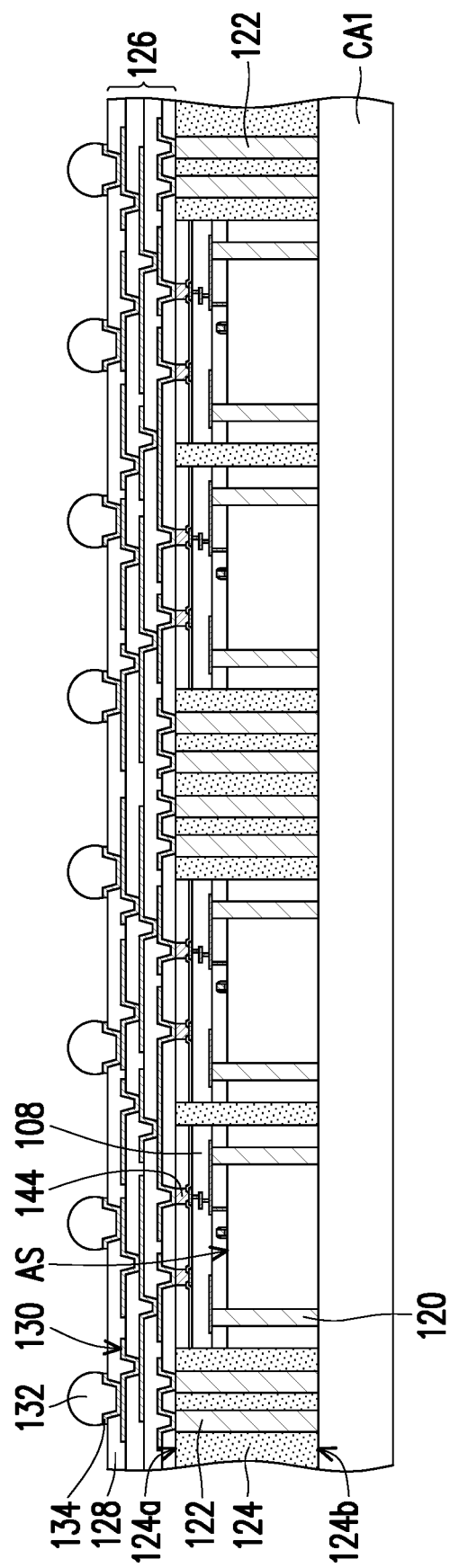

Referring to FIG. 1 and FIG. 2E, step S110 is performed, and a front redistribution structure 126 is formed over the reconstructed wafer as shown in FIG. 2D. As such, a front surface of this reconstructed wafer (i.e., a top surface of this reconstructed wafer as shown in FIG. 2D) facing away from the first carrier CA1 is covered by the front redistribution structure 126. In other words, the front surface 124a of the encapsulant 124 and the front surfaces of the conductive pillars 114 and the through encapsulant vias 122 are covered by the front redistribution structure 126. In some embodiments, the front redistribution structure 126 includes a stack of dielectric layers 128 (e.g. 4 dielectric layers 128) and redistribution elements 130. However, those skilled in the art may adjust the amount of the dielectric layer 128 of the front redistribution structure 126, the present disclosure is not limited thereto. The redistribution elements 130 are formed in the stack of dielectric layers 128. In addition, some of the redistribution elements 130 are electrically connected with the interconnection layers 108 of the semiconductor dies 100 through the conductive pillars 114, whereas others of the redistribution elements 130 are electrically connected with the through encapsulant vias 122. In some embodiments, the redistribution elements 130 include conductive vias, conductive traces or a combination thereof. By disposing the front redistribution structure 126, I/Os (e.g., the conductive pillars 114) of the semiconductor dies 100 can be out-routed to the span of the reconstructed wafer in which the semiconductor dies 100 is laterally encapsulated by the encapsulant 124.

Step S112 is performed, and front electrical connectors 132 are formed over the front redistribution structure 126. The front electrical connectors 132 are electrically connected with the redistribution elements 130 located in the front redistribution structure 126. In some embodiments, the front electrical connectors 132 include controlled collapse chip connection (C4) bumps, solder bumps, ball grid array (BGA) balls, conductive pillars, the like or combinations thereof. A formation method of the front electrical connectors 132 may include patterning the outmost dielectric layer 128 of the front redistribution structure 126. Thereafter, the front electrical connectors 132 are respectively formed in these openings. In some embodiments, under bump metallization (UBM) layers 134 may be formed to respectively cover theses openings of the outmost dielectric layer 128 before forming the front electrical connectors 132. In these embodiments, after forming the front electrical connectors 132, the UBM layers 134 respectively lie between the front electrical connectors 132 and the outmost redistribution elements 130, and between the front electrical connectors 132 and the outmost dielectric layer 128.

Figure 2F:
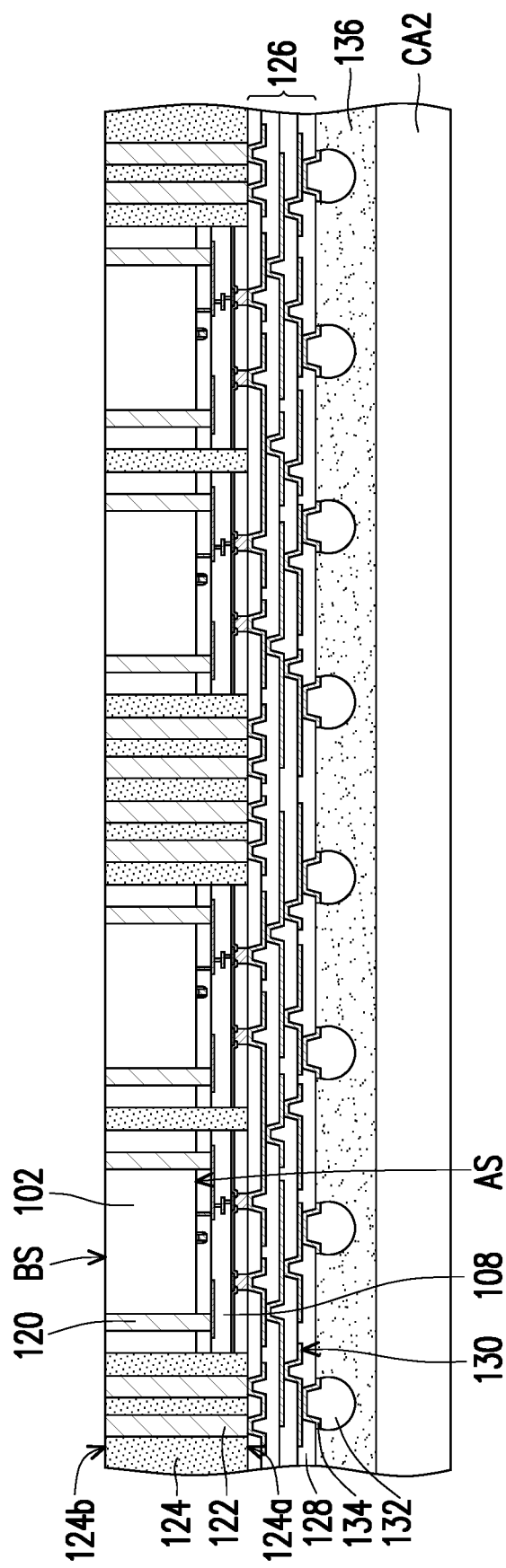

Referring to FIG. 1, FIG. 2E and FIG. 2F, step S114 is performed, and a second carrier CA2 is attached to a front surface of the current package structure (as shown in FIG. 2E) that faces away from the first carrier CA1. In addition, the current structure is flipped over, and the first carrier CA1 is detached from the package structure. In some embodiments, the second carrier CA2 is attached to the front electrical connectors 132 of the package structure. Moreover, in some embodiments, an adhesion layer 136 is pre-formed over a surface of the second carrier CA2 to which front electrical connectors 132 are attached. In this way, after the front electrical connectors 132 are attached with the second carrier CA2, the adhesion layer 136 lies between the front electrical connectors 132 and the second carrier CA2. In some embodiments, the second carrier CA2 is attached to the package structure via a lamination process, and the front electrical connectors 132 may be embedded into the adhesion layer 136. As such, a space between the front redistribution structure 126 and the second carrier CA2 may be further filled by the adhesion layer 136. For instance, the second carrier CA2 is a glass carrier. After the first carrier CA1 is detached, the back surfaces BS of the semiconductor substrates 102, the back surface 124b of encapsulant 124 and back surfaces of the through encapsulant vias 122 and the TSVs 120 facing away from the second carrier CA2 (i.e., top surfaces of the through encapsulant vias 122 and the TSVs 120 as shown in FIG. 2F) are exposed. In some embodiments, an adhesion layer (not shown) such as a LTHC layer or a thermal release layer is pre-formed on the first carrier CA1, and the first carrier CA1 with the adhesion layer is detached as the adhesion layer loses its adhesive property when exposed to light or heat.

Figure 2G:
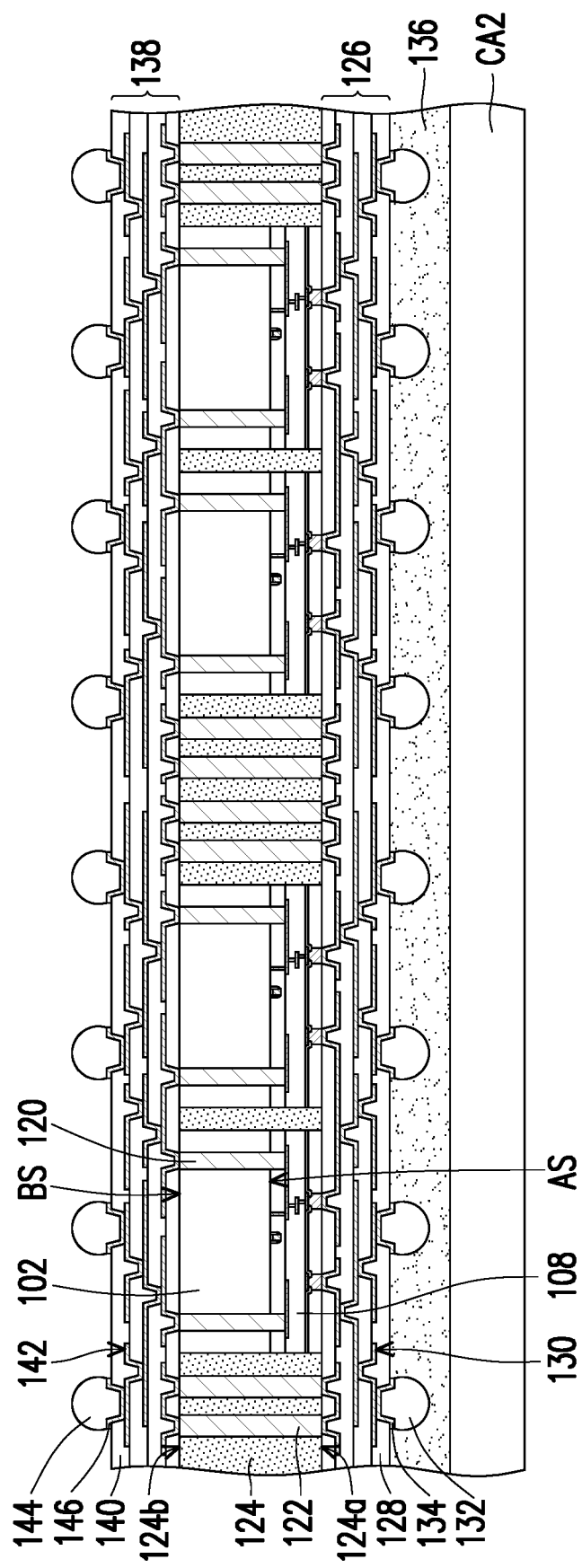

Referring to FIG. 1, FIG. 2F and FIG. 2G, step S116 is performed, and a back redistribution structure 138 is formed over the exposed surface of the current package structure as shown in FIG. 2F. That is, the back surfaces BS of the semiconductor substrates 102, the back surface 124b of the encapsulant 124 and the back surfaces of the through encapsulant vias 122 and the TSVs 120 facing away from the second carrier CA2 are covered by the back redistribution structure 138. In some embodiments, the back redistribution structure 138 includes a stack of dielectric layers 140 (e.g. 4 dielectric layers 140) and redistribution elements 142. However, those skilled in the art may adjust the amount of the dielectric layer 140 of the back redistribution structure 138, the present disclosure is not limited thereto. The redistribution elements 142 are formed in the stack of dielectric layers 140. In addition, some of the redistribution elements 142 are electrically connected with the TSVs 120 of the semiconductor dies 100, whereas others of the redistribution elements 142 are electrically connected with the through encapsulant vias 122. As such, the TSV 120 is electrically connected between the interconnection layer 108 and the back redistribution structure 138, whereas the through encapsulant via 122 is electrically connected between the front and back redistribution structures 126 and 138. In some embodiments, the redistribution elements 142 include conductive vias, conductive traces or a combination thereof.

Step S118 is performed, and back electrical connectors 144 are formed over the back redistribution structure 138. The back electrical connectors 144 are electrically connected with the redistribution elements 142 located in the back redistribution structure 138. In some embodiments, the back electrical connectors 144 include controlled collapse chip connection (C4) bumps, solder bumps, ball grid array (BGA) balls, conductive pillars, the like or combinations thereof. A formation method of the back electrical connectors 144 may include patterning the outmost dielectric layer 140 of the back redistribution structure 138. Thereafter, the back electrical connectors 144 are respectively formed in these openings. In some embodiments, under bump metallization (UBM) layers 146 may be formed to respectively cover theses openings of the outmost dielectric layer 140 before forming the back electrical connectors 144. In these embodiments, after forming the back electrical connectors 144, the UBM layers 146 respectively lie between the back electrical connectors 144 and the outmost redistribution elements 142, and between the back electrical connectors 144 and the outmost dielectric layer 140.

Figure 2H:
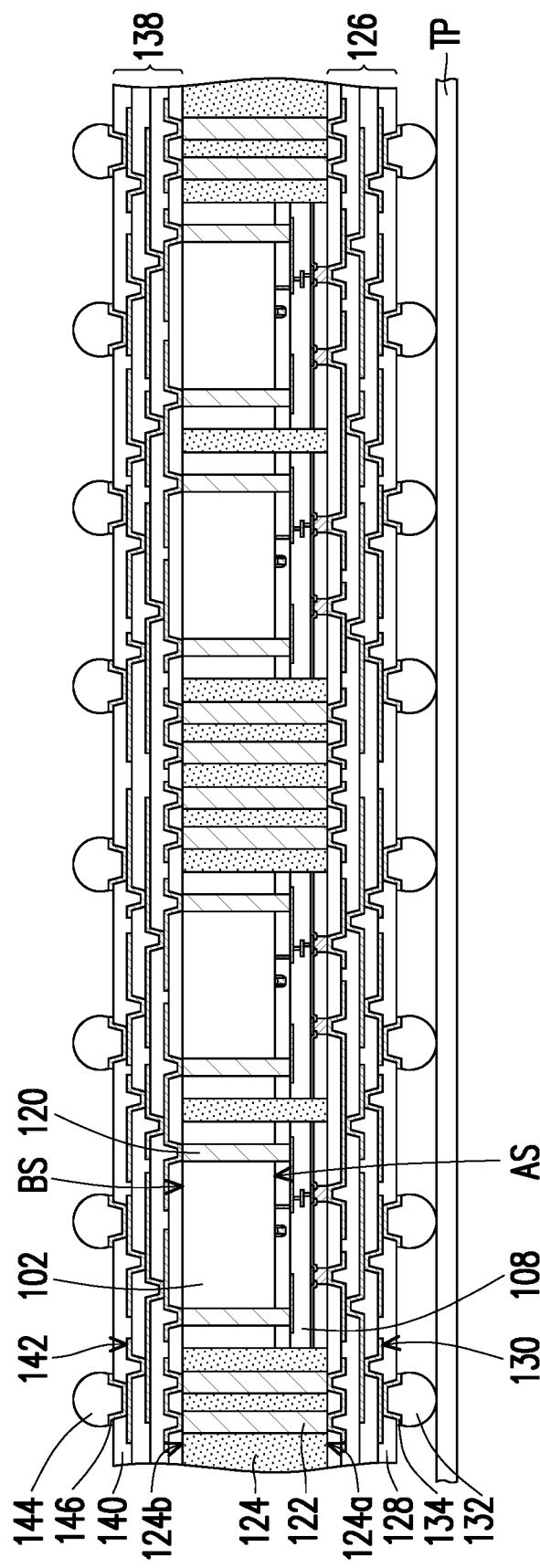

Referring to FIG. 1, FIG. 2G and FIG. 2H, step S120 is performed, and the second carrier CA2 is detached. As such, a front surface and a back surface of the current package structure are exposed. In some embodiments, the front surface of the current package structure includes surfaces of the front electrical connectors 132 and the front redistribution structure 126, whereas the back surface of the current package structure includes surfaces of the back electrical connectors 144 and the back redistribution structure 138. In some embodiments, the adhesion layer 136 pre-formed on the second carrier CA2 is a LTHC layer or a thermal release layer, and the second carrier CA2 with the adhesion layer 136 is detached as the adhesion layer 136 loses its adhesive property when exposed to light or heat. In some embodiments, after detaching the second carrier CA2, the current package structure may be attached to a tape TP. For instance, the current package structure is flipped over, and the front electrical connectors 132 are attached to the tape TP. In some embodiments, the tape TP is connected to a frame (not shown).

Figure 2I:
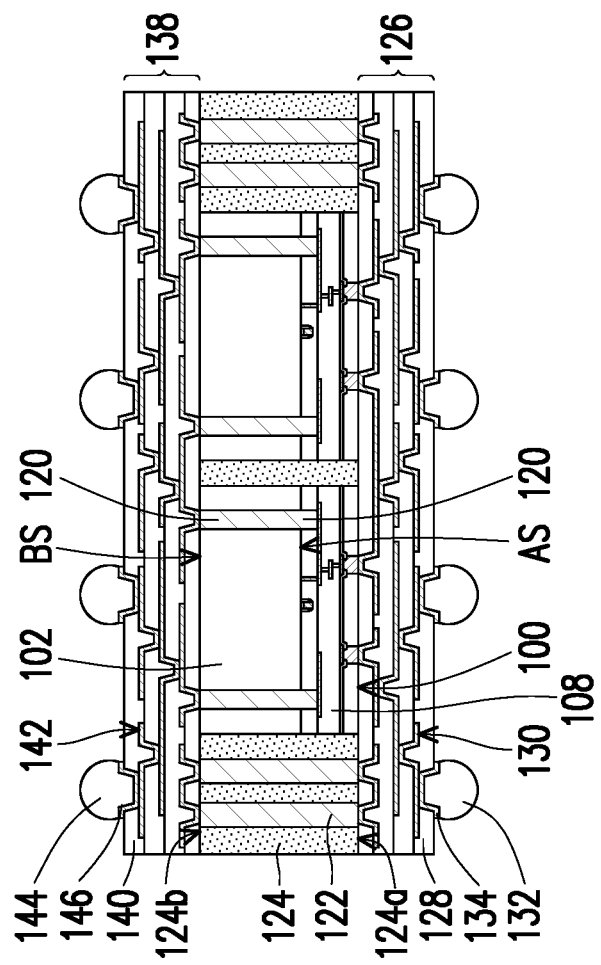

Referring to FIG. 1, FIG. 2H and FIG. 2I, step S122 is performed, and a singulation process may be performed on the current package structure. The singulated package structures are respectively referred as a semiconductor package 10. The semiconductor packages 10 respectively include at least one of the semiconductor dies 100 and the through encapsulant vias 122 located around the semiconductor die(s) 100. In some embodiments, the singulation process includes a sawing process, a laser ablation process, an etching process, the like or combinations thereof.

Figure 2J:
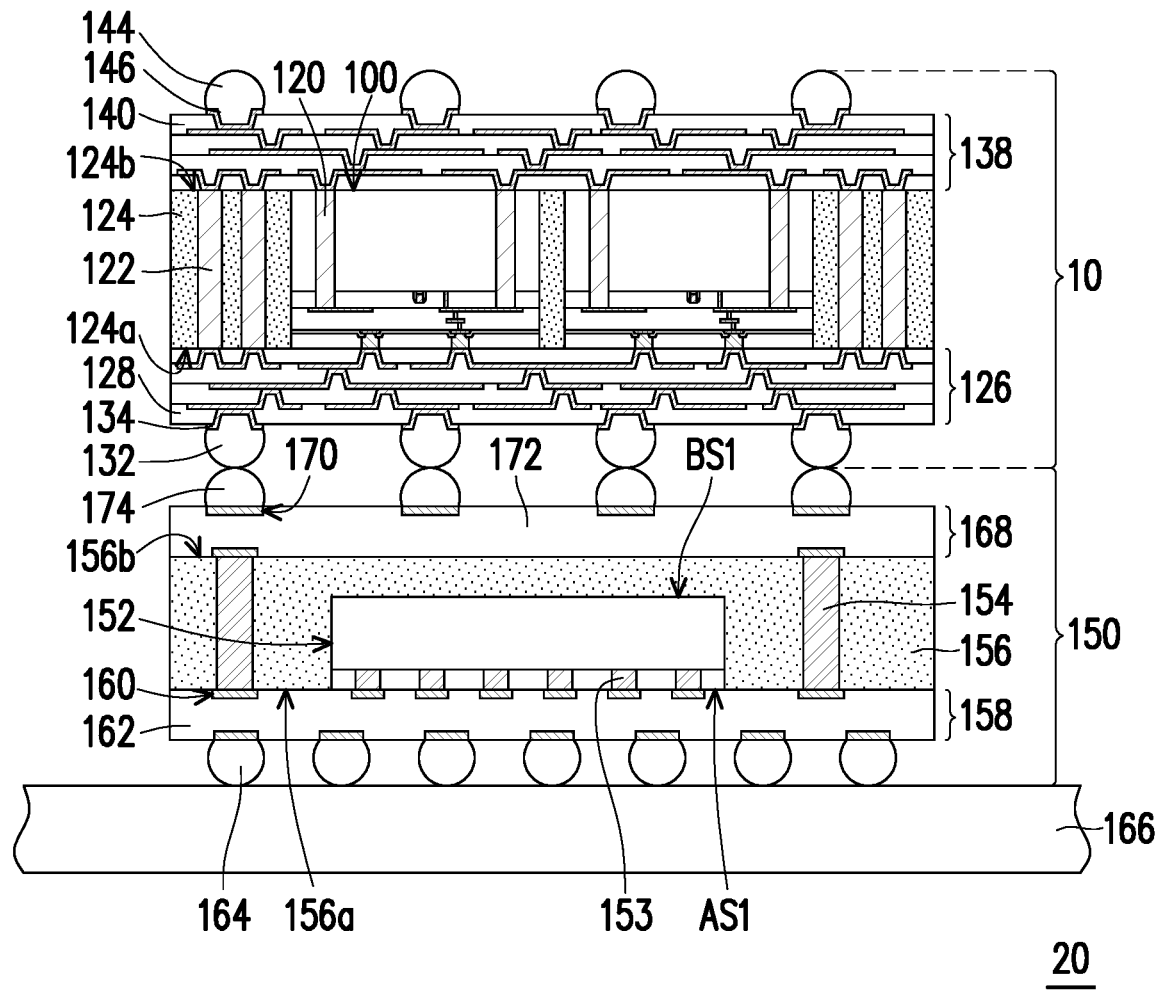

Referring to FIG. 1, FIG. 2I and FIG. 2J, step S124 is performed, and semiconductor package 10 is attached onto a bottom semiconductor package 150. In some embodiments, the bottom semiconductor package 150 includes a semiconductor die 152, through encapsulant vias 154 and an encapsulant 156. The through encapsulant vias 154 are located around the semiconductor die 152. In addition, the semiconductor die 152 and the through encapsulant vias 154 are encapsulated by the encapsulant 156. In some embodiments, the semiconductor die 152 is a logic die, such as a controller die. The semiconductor die 152 may face down. As such, an active surface (or referred as a front surface) AS1 of the semiconductor die 152 faces away from overlying semiconductor package 10, whereas a back surface BS1 of the semiconductor die 152 faces toward the semiconductor package 10. In addition, the active surface AS1 of the semiconductor die 152 is exposed by the encapsulant 156, whereas the back surface BS1 of the semiconductor die 152 may be buried in the encapsulant 156. In some embodiments, the semiconductor die 152 has conductive pillars 153, which are exposed at the active surface AS1 of the semiconductor die 152, and may be functioned as I/Os of the semiconductor die 152.

In some embodiments, a front redistribution structure 158 may be disposed over the active surface AS1 of the semiconductor die 152, a front surface 156a of the encapsulant 156 and front surfaces of the through encapsulant vias 154 facing away from the overlying semiconductor package 10. The front redistribution structure 158 includes redistribution elements 160 and at least one dielectric layer 162. The redistribution elements 160 are embedded in the dielectric layer(s) 162, and are electrically connected with the I/Os (e.g., the conductive pillars 153) of the semiconductor die 152 and the through encapsulant vias 154. It should be noted that, the redistribution elements 160 are schematically depicted in FIG. 2J, and may actually include conductive traces, conductive vias or a combination thereof. By disposing the front redistribution structure 158, the I/Os (e.g., the conductive pillars 153) of the semiconductor die 152 can be out-routed to a span of a reconstructed wafer including the semiconductor die 152 and the encapsulant 156. In some embodiments, front electrical connectors 164 may be disposed over a surface of the front redistribution structure 158 (i.e., a bottom surface of the front redistribution structure 158 as shown in FIG. 2J). The front electrical connectors 164 are electrically connected with the redistribution elements 160 formed in the front redistribution structure 158. In some embodiments, the front electrical connectors 164 may include C4 bumps, solder bumps, ball grid array (BGA) balls, the like or combinations thereof. Furthermore, in some embodiments, the front electrical connectors 164 are attached with a package substrate 166. As such, the front electrical connectors 164 are connected between the front redistribution structure 158 and the package substrate 166. In some embodiments, the package substrate 166 may be a printed circuit board (PCB), such as a core PCB or a coreless PCB.

In some embodiments, a back redistribution structure 168 may be disposed over a back surface 156b of the encapsulant 156 and back surfaces of the through encapsulant vias 154 facing toward the semiconductor package 10. The back redistribution structure 168 includes redistribution elements 170 and at least one dielectric layer 172. The redistribution elements 170 are embedded in the dielectric layer(s) 172, and are electrically connected with the through encapsulant vias 154. In those embodiments of which the back surface BS1 of the semiconductor die 152 is buried in the encapsulant 156, the redistribution elements 170 of the back redistribution structure 168 are not in direct electrical contact with the semiconductor die 152, but may be electrically connected to the semiconductor die 152 by the through encapsulant vias 154 and the front redistribution structure 158. It should be noted that, the redistribution elements 170 are schematically depicted in FIG. 2J, and may actually include conductive traces, conductive vias or a combination thereof. In some embodiments, back electrical connectors 174 may be disposed over a surface of the back redistribution structure 168 (i.e., a top surface of the back redistribution structure 168 as shown in FIG. 2J). The back electrical connectors 174 are electrically connected with the redistribution elements 170 formed in the back redistribution structure 168. In some embodiments, the electrical connection between the semiconductor package 10 and the bottom semiconductor package 150 is realized by bonding the front electrical connectors 132 of the semiconductor package 10 with the back electrical connectors 174 of the bottom semiconductor package 150. In some embodiments, the back electrical connectors 174 may include C4 bumps, solder bumps, ball grid array (BGA) balls, the like or combinations thereof.

Figure 2K:
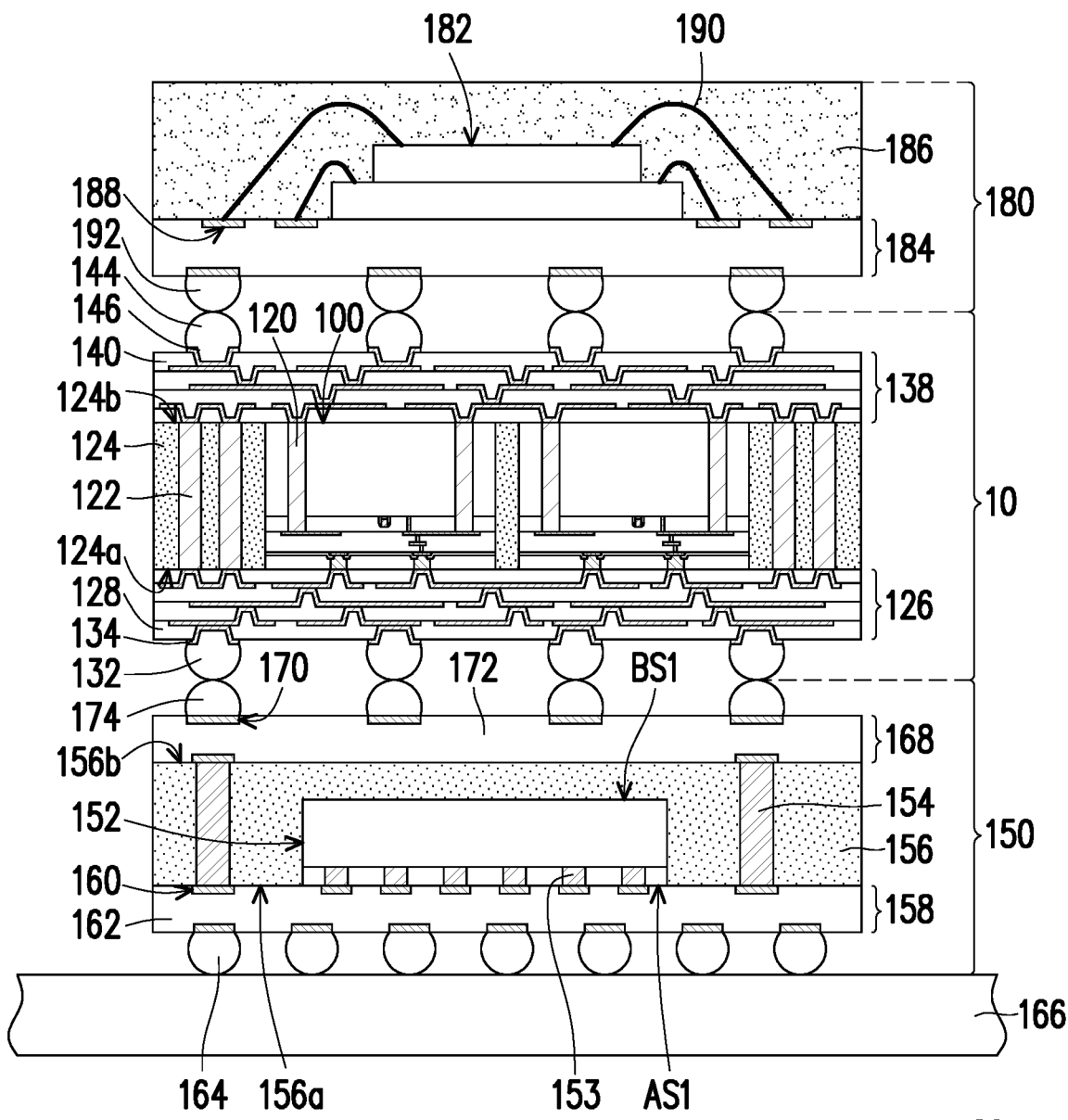

Referring to FIG. 1 and FIG. 2K, step S126 is performed, and a top semiconductor package 180 is attached onto the semiconductor package 10. In some embodiments, the top semiconductor package 180 includes a stack of semiconductor dies 182, a substrate 184 and an encapsulant 186. The stack of the semiconductor dies 182 is disposed over the substrate 184, and is encapsulated by the encapsulant 186. In some embodiments, the semiconductor dies 182 includes a logic die, a memory die (e.g., a low power memory die), the like or combinations thereof. Interconnection elements 188 may be formed in the substrate 184, and semiconductor devices (not shown) in the semiconductor dies 182 may be electrically connected with the interconnection elements 188 through bonding wires 190. In some embodiments, electrical connectors 192 are disposed at a surface of the substrate 184 facing toward the semiconductor package 10, and are electrically connected with the interconnection elements 188 in the substrate 184. In some embodiments, the electrical connection between the top semiconductor package 180 and the semiconductor package 10 is realized by bonding the electrical connectors 192 of the top semiconductor package 180 with the back electrical connectors 144. For instance, the electrical connectors 192 may include C4 bumps, solder bumps, ball grid array (BGA) balls, the like or combinations thereof.

Up to here, a semiconductor package stack 20 including the middle semiconductor package (i.e., the semiconductor package 10), the bottom semiconductor package 150 and the top semiconductor package 180 is formed, and can be regarded as a package-on-package (PoP) structure. The semiconductor package 10 is stacked between the top semiconductor package 180 and the bottom semiconductor package 150, and includes both of the through encapsulant vias 122 and the TSVs 120. In the semiconductor package 10, the through encapsulant via 122 penetrates through the encapsulant 124 that laterally surrounds the semiconductor die 100, whereas the TSV 120 penetrates the semiconductor die 100 from a back side of the semiconductor die 100 to an active side of the semiconductor die 100. As such, communications between the top semiconductor package 180 and the bottom semiconductor package 150 can be realized via the through encapsulant via 122. In some embodiments, the through encapsulant via 122 is electrically connected to the top semiconductor package 180 via the back redistribution structure 138 and the back electrical connector 133, and is electrically connected to the bottom semiconductor package 150 via the front redistribution structure 126 and the front electrical connectors 132. On the other hand, signals from the back side of the semiconductor die 100 (e.g., signals from the top semiconductor package 180) can be transmitted to the active side of the semiconductor die 100 via the back redistribution structure 138 and the TSV 120 without going through the through encapsulant via 122 and the front redistribution structure 126 disposed at the active side of the semiconductor die 100, and vice versa. As such, transmission length of the signals transmitted between the back side of the semiconductor die 100 and the active side of the semiconductor die 100 is shortened. In addition, requirement on routing density of the front redistribution structure 126 of the semiconductor package 10 can be alleviated, and reliability of the semiconductor package 10 can be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor package, comprising:

providing a semiconductor die, wherein the semiconductor die comprises a semiconductor substrate, an interconnection layer and a through semiconductor via, the interconnection layer is disposed on an active surface of the semiconductor substrate, the through semiconductor via penetrates the semiconductor substrate from a back surface of the semiconductor substrate to the active surface of the semiconductor substrate;

laterally encapsulating the semiconductor die with an encapsulant;

forming a through encapsulant via penetrating through the encapsulant;

attaching the semiconductor die onto a first carrier before forming the encapsulant, wherein the back surface of the semiconductor substrate faces toward the first carrier, and the active surface of the semiconductor substrate faces away from the first carrier;

after forming the encapsulant and the through encapsulant via, attaching a second carrier to surfaces of the encapsulant, the semiconductor die and the through encapsulant via that face away from the first carrier;

detaching the first carrier after forming the encapsulant and the through encapsulant via;

forming a back redistribution structure over the back surface of the semiconductor substrate and a back surface of the encapsulant, wherein the back redistribution structure is electrically connected with the through semiconductor via and the through encapsulant via;

forming back electrical connectors over the back redistribution structure, wherein the back electrical connectors are electrically connected with the back redistribution structure; and detaching the second carrier.

2. The manufacturing method of the semiconductor package of claim 1, wherein the step of forming the through encapsulant via precedes the step of forming the encapsulant.

3. The manufacturing method of the semiconductor package of claim 2, wherein the steps of forming the encapsulant, attaching the semiconductor die to the first carrier and forming the through encapsulant via comprises:

forming the through encapsulant via over a surface of the first carrier;

attaching the semiconductor die onto the surface of the first carrier; and laterally encapsulating the semiconductor die and the through encapsulant via with the encapsulant.

4. The manufacturing method of the semiconductor package of claim 1, wherein the step of forming the through encapsulant via follows the step of forming the encapsulant.

5. The manufacturing method of the semiconductor package of claim 4, wherein the steps of attaching the semiconductor die to the first carrier, forming the encapsulant and forming the through encapsulant via comprises:

attaching the semiconductor die onto a surface of the first carrier;

laterally encapsulating the semiconductor die with the encapsulant;

removing a portion of the encapsulant to form a through hole; and filling the through hole with a conductive material, to form the through encapsulant via.

6. The manufacturing method of the semiconductor package of claim 1, further comprising:

forming a front redistribution structure over the interconnection layer and a front surface of the encapsulant, wherein the front redistribution structure is electrically connected with the interconnection layer and the through encapsulant via; and forming front electrical connectors over the front redistribution structure, wherein the front electrical connectors are electrically connected with the front redistribution structure.

7. A manufacturing method of a semiconductor package stack, comprising:

the manufacturing method of the semiconductor package of claim 1;

attaching a top semiconductor package to a top surface of the semiconductor package, wherein the top semiconductor package is electrically connected with the through semiconductor via and the through encapsulant via, and attaching a bottom semiconductor package to a bottom surface of the semiconductor package, wherein the bottom semiconductor package is electrically connected with the interconnection layer and the through encapsulant via.

\* \* \* \* \*